(12) United States Patent
Wang et al.

(10) Patent No.: US 8,601,407 B2
(45) Date of Patent: Dec. 3, 2013

(54) GEOMETRIC PATTERN DATA QUALITY VERIFICATION FOR MASKLESS LITHOGRAPHY

(75) Inventors: Hung-Chun Wang, Ching-Suei (TW); Pei-Shiang Chen, Hsinchu (TW); Tzu-Chin Lin, Hsinchu (TW); Cheng-Hung Chen, Changhua (TW); Shih-Chi Wang, Taipei (TW); Nian-Fuh Cheng, Hsinchu (TW); Jeng-Horng Chen, Hsin-Chu (TW); Wen-Chun Huang, Tainan (TW); Ru-Gun Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/217,345

(22) Filed: Aug. 25, 2011

(65) Prior Publication Data

US 2013/0055173 A1  Feb. 28, 2013

(51) Int. Cl.
*G06F 17/50* (2006.01)

(52) U.S. Cl.
USPC .............. 716/55; 716/50; 716/51; 716/52; 716/53; 716/54; 430/5; 430/30

(58) Field of Classification Search
USPC .................... 716/50–55; 430/5, 30
See application file for complete search history.

(56) References Cited

U.S. PATENT DOCUMENTS

| | | | |
|---|---|---|---|
| 6,341,007 B1 | 1/2002 | Nishi et al. | |
| 6,498,685 B1 | 12/2002 | Johnson | |
| 7,530,048 B2 * | 5/2009 | Joshi | 716/53 |
| 7,624,369 B2 * | 11/2009 | Graur et al. | 716/54 |
| 7,788,630 B2 * | 8/2010 | Li et al. | 716/55 |
| 7,795,601 B2 | 9/2010 | Lin et al. | |
| 7,851,774 B2 | 12/2010 | Lin et al. | |
| 2005/0102723 A1 | 5/2005 | Van Den Nieuwelaar et al. | |
| 2007/0278424 A1 | 12/2007 | Lin et al. | |

OTHER PUBLICATIONS

Chen, Jack J. H., et al., "Multiple Electron Beam Maskless Lithography for High-Volume Manufacturing," Taiwan Semiconductor Manufacturing Company, Ltd., 3 pages.
Unpublished U.S. Appl. No. 13/225,617, filed Sep. 6, 2011, entitled "Striping Methodology for Maskless Lithography," 34 pages.
Unpublished U.S. Appl. No. 12/411,229, filed Mar. 25, 2009 entitled "High Volume Manufacturing Massive E-Beam Maskless Lithography System", 26 pages.

* cited by examiner

*Primary Examiner* — Nghia Doan
(74) *Attorney, Agent, or Firm* — Haynes and Boone, LLP

(57) ABSTRACT

Provided is a method of performing a maskless lithography process. The method includes providing a proximity correction pattern. The method includes generating a deformed pattern based on the proximity correction pattern. The method includes performing a first convolution process to the proximity correction pattern to generate a first proximity correction pattern contour. The method includes processing the first proximity correction pattern contour to generate a second proximity correction pattern contour. The method includes performing a second convolution process to the deformed pattern to generate a first deformed pattern contour. The method includes processing the first deformed pattern contour to generate a second deformed pattern contour. The method includes identifying mismatches between the second proximity correction pattern contour and the second deformed pattern contour. The method includes determining whether the deformed pattern is lithography-ready in response to the identifying.

20 Claims, 6 Drawing Sheets

GEOMETRIC PATTERN DATA QUALITY VERIFICATION FOR MASKLESS LITHOGRAPHY

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

To achieve greater functional density and miniature geometry sizes for semiconductor devices, various advanced lithography techniques have been proposed and implemented. Among these advanced lithography techniques is maskless lithography, which does not require a photomask to perform a lithography process. For example, in an electron beam lithography process, beams of electrons are emitted in a patterned fashion on a resist material to expose and develop the resist material into a patterned resist mask. The patterned resist mask can then be used to pattern the various layers of a substrate below.

Maskless lithography offers advantages such as enhanced lithography resolution and patterning precision. However, existing maskless lithography processes also have drawbacks. For example, a data accuracy verification process may need to be performed to ensure that the integrity of semiconductor device patterns will be maintained during the maskless lithography process. This data accuracy verification process for conventional maskless lithography processes may not give sufficiently accurate results.

Therefore, while existing maskless lithography processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
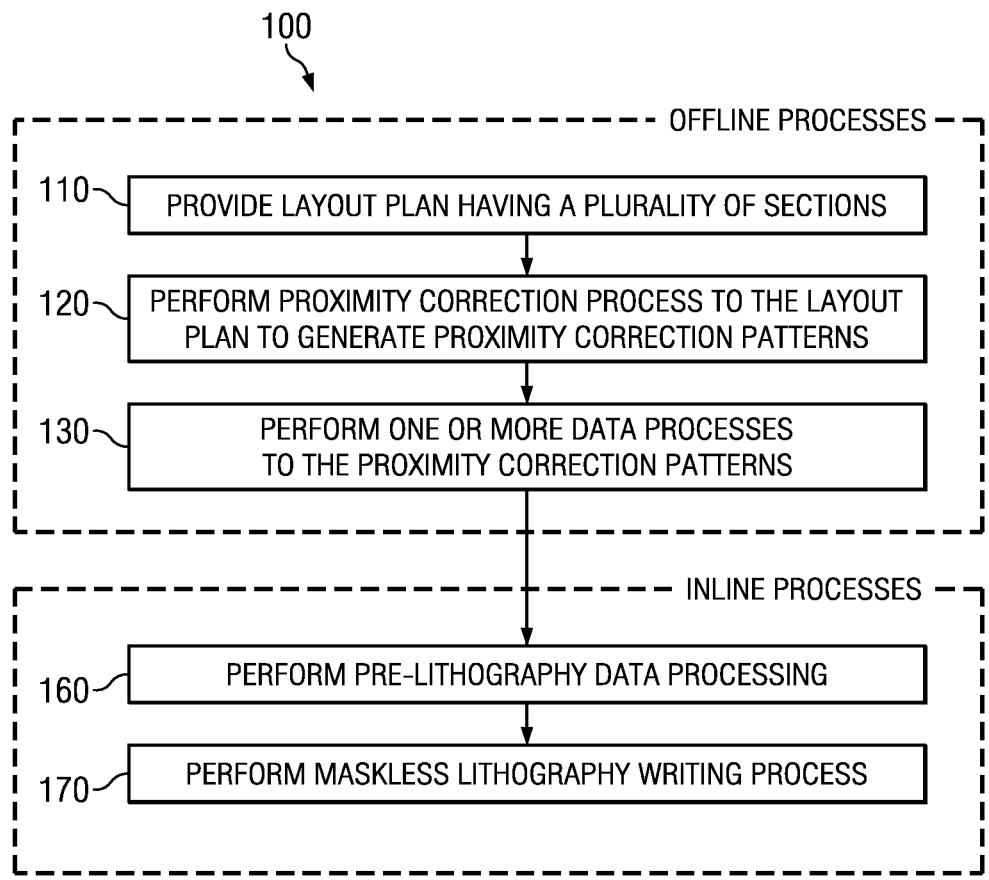
FIG. 1 is a flowchart illustrating a method of fabricating a semiconductor device according to an embodiment of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As semiconductor fabrication technologies continue to evolve, maskless lithography processes have been utilized to achieve increasing functional densities and decreasing device sizes. One form of maskless lithography is electron beam lithography. In electron beam lithography, an electron beam apparatus emits beams of electrons in a patterned manner across a surface of a substrate covered with a resist film. This process may be referred to as an exposure process. The electron beam apparatus also selectively removes either exposed regions or non-exposed regions of the resist film. This process may be referred to as a developing process. The developing of the resist film results in a patterned resist film, which may be used as a patterned mask to pattern the substrate therebelow in subsequent fabrication processes.

Maskless lithography techniques overcome the diffraction limit of light, which has been a bottleneck for traditional photolithography processes. Consequently, maskless lithography may offer benefits such as enhanced resolution and increased precision compared to traditional photolithography processes. FIG. 1 illustrates a method 100 of performing a maskless lithography process according to aspects of the present disclosure. The method 100 includes blocks 110-170, each of which is discussed below in more detail.

In block 110, a layout plan or layout design is provided for an integrated circuit (IC). The IC layout plan may contain a plurality of semiconductor features. The IC layout plan may be generated as a computer file, for example as a Graphic Database System (GDS) type file or as an Open Artwork System Interchange Standard (OASIS) type file. The GDS or OASIS files are database files used for data exchange of IC layout artwork. For example, these files may have binary file formats for representing planar geometric shapes, text labels, as well as other layout information of the IC layout. The GDS or OASIS files may be used to reconstruct the IC layout artwork, and as such can be transferred or shared between various fabrication tools.

Figure 2:
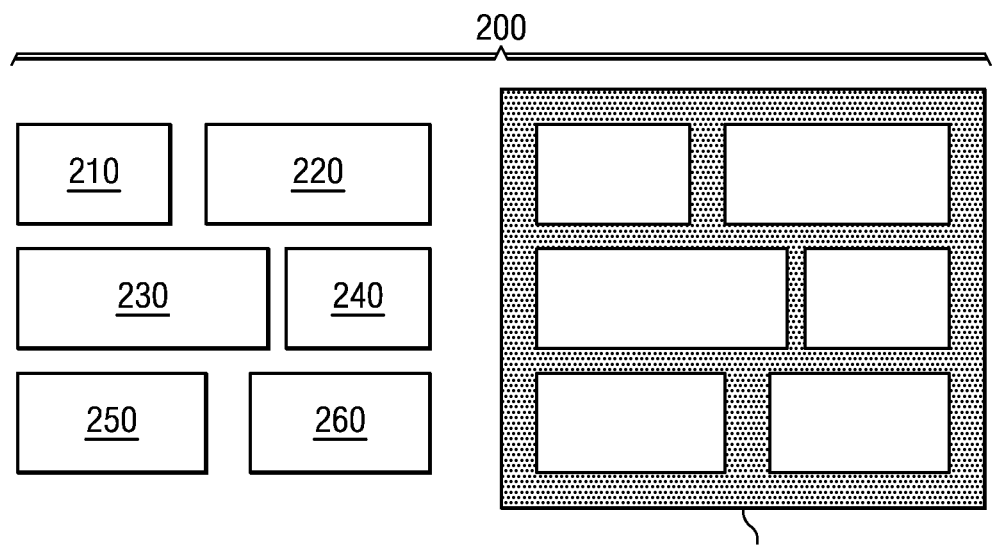
FIG. 2 illustrates an example integrated circuit (IC) layout plan according to an embodiment of the present disclosure.

For the sake of providing an example, a simplified IC layout plan 200 is illustrated in FIG. 2. The IC layout plan 200 includes a plurality of circuit sections or blocks 210-270. In the illustrated embodiment, the sections 210-260 are different logic blocks, and the section 270 is a frame inside which the logic blocks 210-260 reside. It is understood that the circuit sections 210-260 may have varying sizes. The sizes may refer to physical dimensions of the circuit sections 210-260 or the amount of data contained within each section. For example, as shown in FIG. 2, the sections 220 and 230 may have greater sizes than the other sections.

Referring back to FIG. 1, the method 100 includes block 120, in which a proximity correction process is performed to the IC layout plan generated in block 110. The proximity correction process is a lithography enhancement technique that can be used to compensate for image errors due to process defects. For example, electron scattering during the performance of a maskless lithography process may adversely impact regions of the substrate near the region that is being exposed by the electron beams. Consequently, these nearby regions may become inadvertently exposed, thereby causing variations of the desired exposure pattern. To compensate for these image errors, proximity correction techniques such as dose modification, shape modification, or background correction exposure may be employed in a maskless lithography process. The performance of the proximity correction process in block 120 helps make the fabricated semiconductor feature patterns resemble the desired patterns more accurately.

Figure 3:
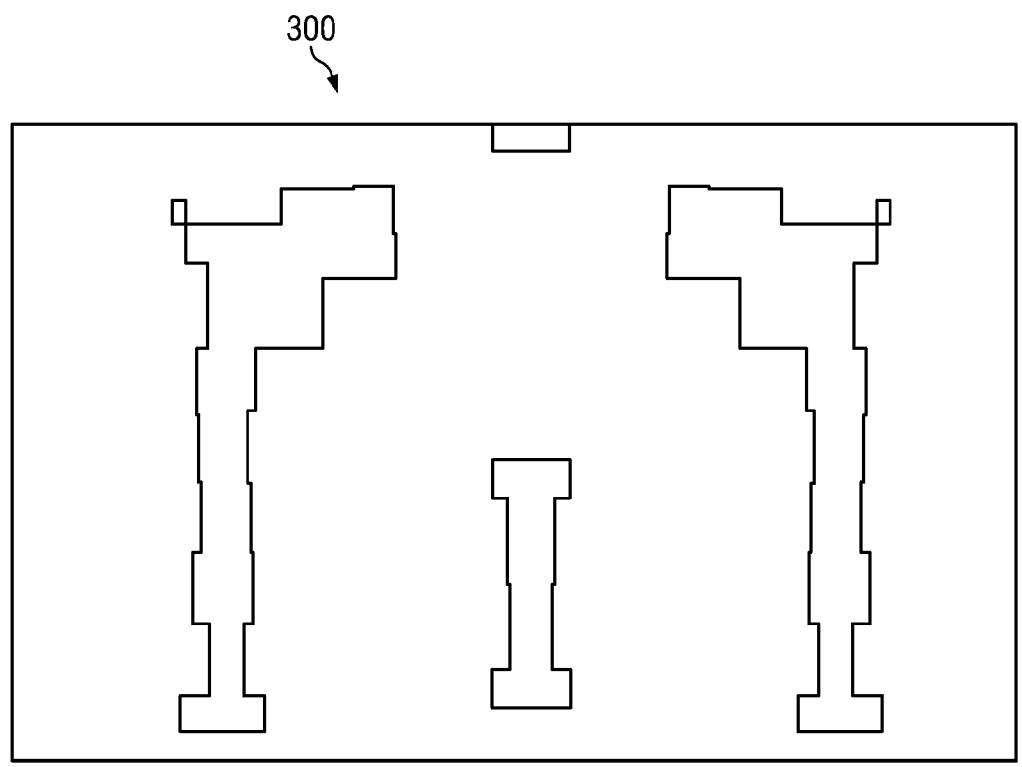
FIG. 3 illustrates an example proximity correction pattern according to an embodiment of the present disclosure.

The proximity correction process in block 120 generates a plurality of proximity correction patterns, an example one of which is illustrated in FIG. 3. Referring to FIG. 3, an example proximity correction pattern 300 may represent a portion of a device layout pattern for one of the circuit sections 210-260 of FIG. 2, or a portion of a device layout pattern for alternative an alternative circuit. The proximity correction pattern 300 may include one or more blocks or polygons, which may have irregular shapes as illustrated in FIG. 3. In some embodiments, these polygons may resemble original patterns according to a design layout, but they may have assistant features incorporated therein.

Referring back to FIG. 1, the method 100 includes block 130, in which one or more data processes are performed to the proximity correction patterns (or to the layout plan). In an embodiment, the data processes include performing a striping process on one or more sections of the layout file, in which these sections are striped by a plurality of elongate stripes that correspond to radiation energy beams (e.g., electron beams) that can be emitted by a maskless lithography apparatus. In another embodiment, the data processes include merging various sections of the layout plan into a single file. In other embodiments, the data processes include dividing the layout plan into a plurality of portions, each one of which is capable of being striped. It is understood that additional data processes may exist, but they are not discussed herein for the sake of simplicity.

In FIG. 1, the blocks 110-130 of the method 100 may be considered offline processes. That is, the blocks 110-130 are performed by fabrication tools that are not a part of the maskless lithography tool itself. For example, the blocks 110-130 may be performed by one or more computer servers running computer software instructions.

After the execution of block 130 is completed, the data (including the proximity patterns generated by the offline processes discussed above) are transferred to a maskless lithography tool or system. In an embodiment, the maskless lithography tool or system includes an electron beam lithography apparatus, the details of which will be described in more detail below with reference to FIGS. 7-9. The maskless lithography apparatus performs blocks 160 and 170 of the method 100, and as such the blocks 160 and 170 may be referred to as inline processes.

Figure 4:
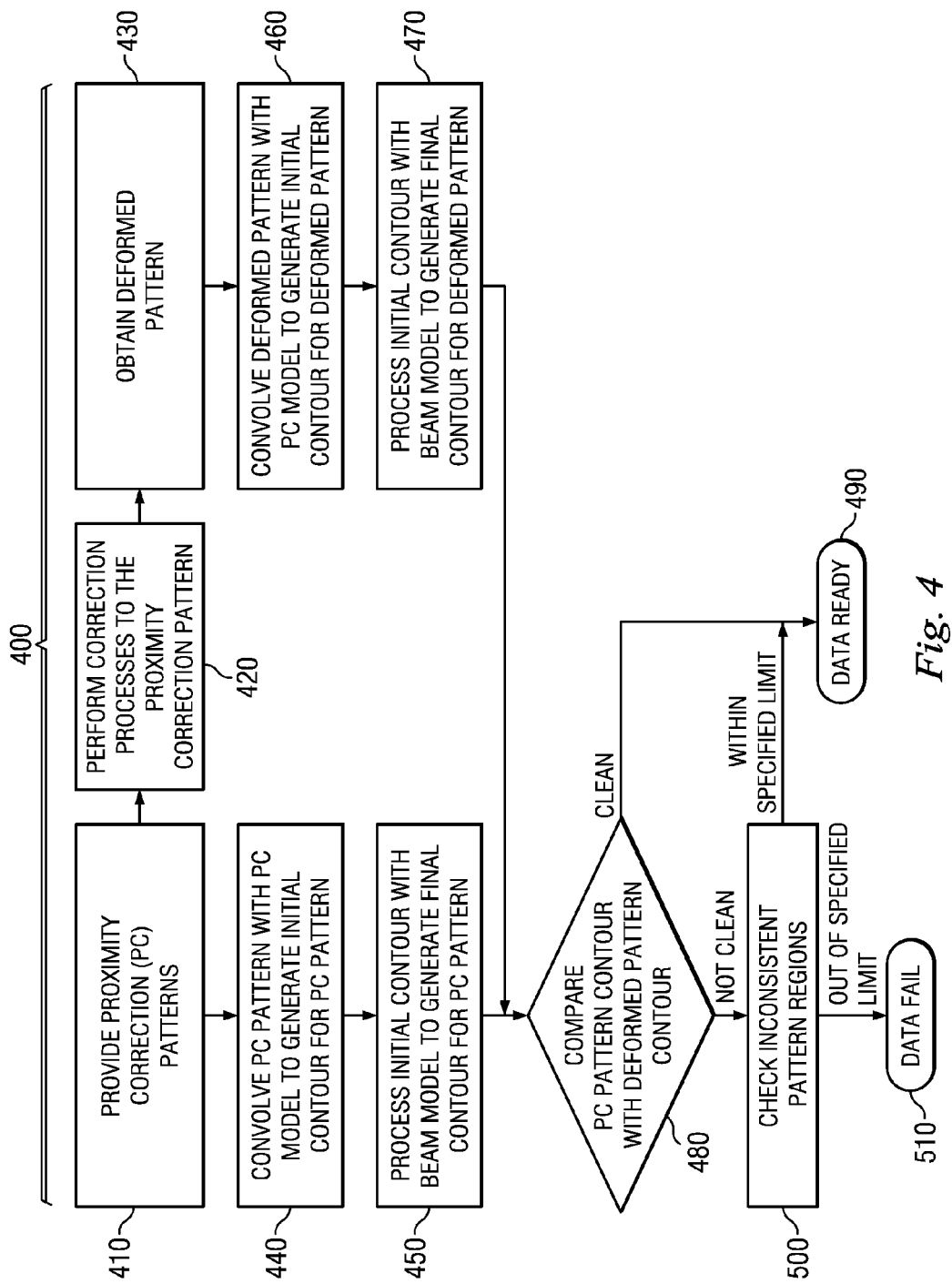
FIG. 4 is a flowchart illustrating a method of performing various data processes before a maskless lithography writing process is performed according to an embodiment of the present disclosure.

In block 160, pre-lithography data processing is performed on the received file. The pre-lithography data processing involves a plurality of processes. Referring to FIG. 4, a method 400 of performing the pre-lithography processes is shown as a flowchart according to an embodiment of the present disclosure. The method 400 includes blocks 410-510 in the embodiment shown. In block 410, one or more proximity correction patterns (PC patterns) are provided. In an embodiment, the proximity correction patterns are generated from the offline processes (by processing the IC layout plan) discussed above with reference to FIG. 1. To facilitate the ensuing discussions, the proximity correction pattern 300 of FIG. 3 will be used as an example.

The method 400 includes block 420 in which one or more correction processes are performed on the proximity patterns of the block 410. The correction processes of block 420 may be error correction or noise reduction processes. In an embodiment, the correction processes of block 420 include a dithering process. In another embodiment, the correction processes of block 420 include a snapping process. In yet another embodiment, the correction processes of block 420 include beam correction processes.

Figure 5:
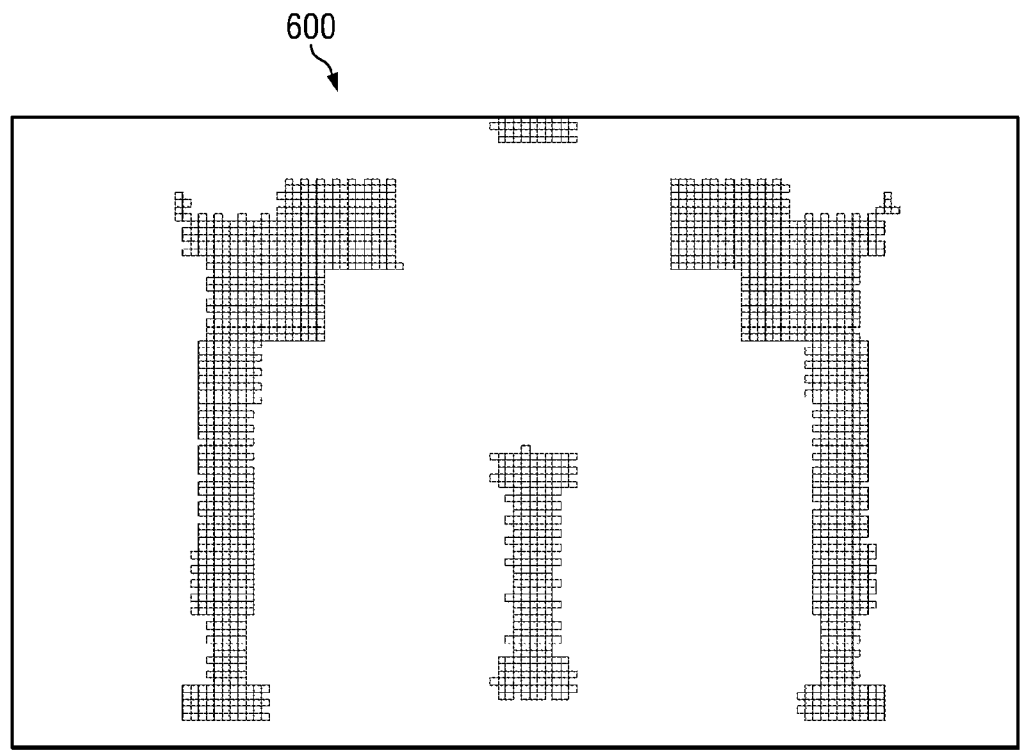
FIG. 5 illustrates an example deformed pattern according to an embodiment of the present disclosure.

The performance of the correction processes of block 420 leads to a "deformed patterned" being generated in block 430. The deformed pattern may resemble the proximity correction pattern of block 410 but may contain geometrical differences from the proximity correction pattern in some regions. To visually illustrate this concept, referring to FIG. 5, which illustrates a deformed pattern 600 that is obtained by performing one or more of the correction processes of block 420 to the pattern 300. The deformed pattern 600 may have an overall appearance that is similar to the proximity pattern 300, but the patterns 600 and 300 do not have a 1 to 1 correspondence.

In conventional maskless lithography processes, a data verification process may be performed to compare the proximity correction patterns and their corresponding deformed patterns. The data verification process may compare the exact shapes and geometries of the proximity correction patterns and the deformed patterns and thereafter identify mismatches between these patterns. If the mismatches exceed a predefined threshold, the deformed patterns will not be deemed to be "data ready," and therefore no maskless lithography writing process will be performed.

One problem with the conventional data verification process discussed above is that it may be unnecessarily strict. In fabrication, some of the mismatches between the proximity correction patterns and deformed patterns may not result in geometric deviations of actually fabricated semiconductor device patterns, which may appear as contours. In other words, some of these "mismatches" may be harmless or inconsequential. Consequently, the strict conventional data verification process may result in an excessively high failure rate.

To overcome the issues associates with conventional maskless lithography processes, the method 400 of FIG. 4 runs the proximity correction patterns and the deformed patterns through blocks 440-450 and blocks 460-470, respectively. In block 440, a convolution process is performed by convolving the proximity correction patterns of block 410 with a proximity correction model. The proximity correction model may be established using wafer fabrication data and various wafer parameters (such as parameters associated with resist materials on the wafer) to help predict lithography performance. In an embodiment, the proximity correction model includes electronic beam characteristics functions and parameters, as well as electronic beam spread function and resist information. The convolution process generates an initial contour for each of the proximity correction patterns.

Thereafter, in block 450, the initial contours of the proximity correction patterns are processed with a beam model to generate a final contour for the proximity correction pattern. The beam model includes descriptions of the behavior of the maskless lithography system such as the electron beam machine. For example, the beam model may contain the dose information of the electron beams. Such information may be used to perform compensations. In this manner, the beam model can be used to predict the characteristics of actual fabricated patterns.

Figure 6A:
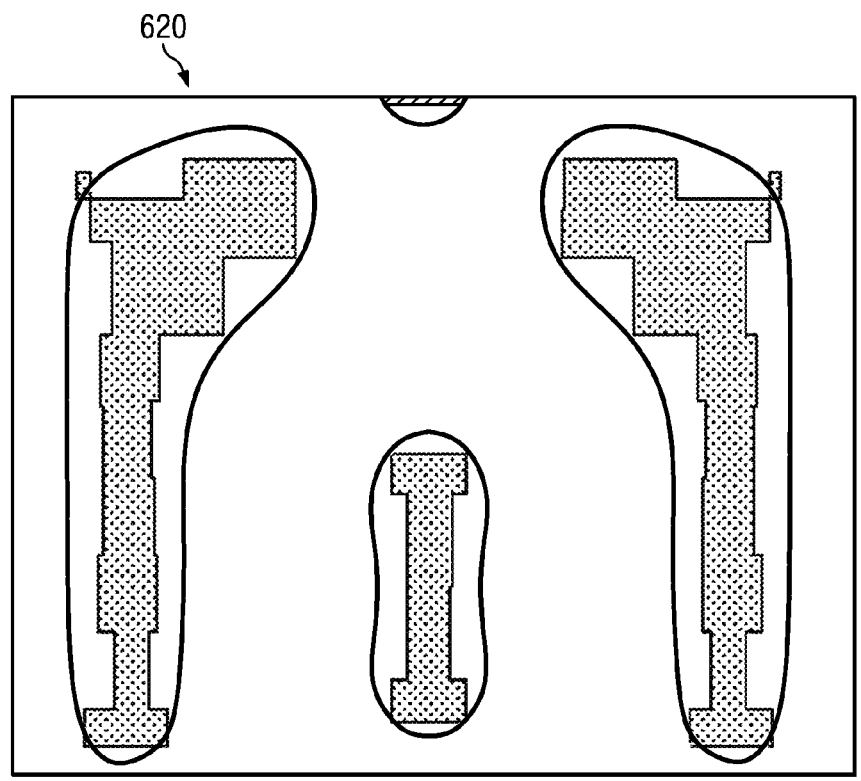
FIGS. 6A and 6B are contours of the proximity correction pattern and the deformed pattern, respectively.

The processing of the initial contours of the proximity correction patterns by the beam model of block 450 produces the final contours of the proximity correction patterns. An example one of such final contours of the proximity correction pattern is illustrated in FIG. 6A as contour 620. The contour 620 contains segments that may have smoother profiles than the polygon blocks of the proximity correction pattern 300. For the sake of illustration, the polygon blocks of the proximity correction pattern 300 are superimposed inside the segments of the contour 620. The contour 620 may be a visual indication of what the proximity correction pattern will appear on a wafer.

Figure 6B:
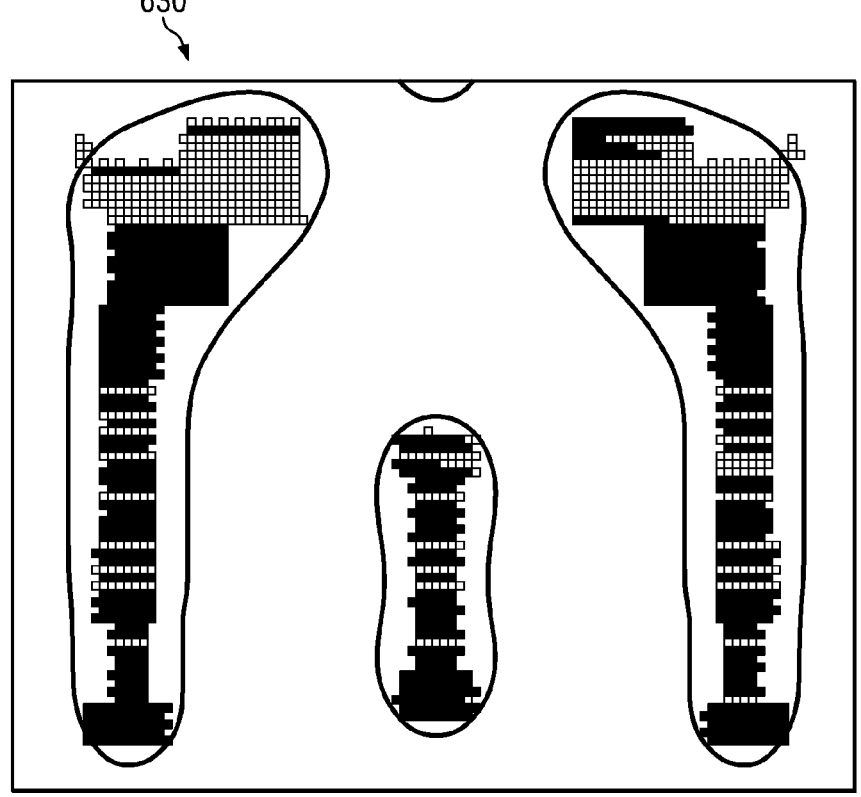

Referring back to FIG. 4, the deformed patterns of block 430 undergo a convolution process in block 460, in which the deformed pattern is convolved with the proximity correction model discussed above with reference to block 440. Hence, the execution of block 460 produces initial contours for the deformed patterns. Thereafter, these initial patterns are processed by the beam model discussed above with reference to block 450 to produce the final contours of the deformed patterns. An example one of such final contours is illustrated in FIG. 6B as contour 630. Once again, the polygon blocks of the deformed pattern 600 are superimposed inside the segments of the contour 630.

Referring back to FIG. 4, the method 400 includes block 480, in which the final contour of the PC pattern from block 450 is compared with the final contour of the deformed pattern from block 470. In an embodiment, the shapes or geometries of these contours are compared in block 480. In an embodiment, an XOR logic operation is used to carry out the comparison process. In an embodiment, the comparison process in block 480 is carried out uses a gauge-based method (1-dimensional comparison process). In another embodiment, the comparison process in block is carried out using a pixel-based method (2-dimensional comparison process).

The comparison process in block 480 identifies differences or mismatches between the proximity correction pattern contour and the deformed pattern contour. The comparison between contours represents a better way to verify data accuracy, since these contours more closely simulate the shapes of actual fabricated patterns on the wafer. Some of the differences between the proximity pattern 300 of FIG. 3 and the deformed pattern 600 of FIG. 5 may not result in differences between their respective contours. Thus, the comparison between contours will give a more accurate indication of whether the deformed pattern is "clean" enough to be verified.

If the comparison process of block 480 indicates that there are no differences between the contours from blocks 450 and 470, or that the differences are substantially negligible, the deformed pattern is deemed "clean" and its data accuracy is verified. The method 400 will then proceed to block 490, which is a "data ready" stage. Alternatively stated, the deformed pattern is ready to be used for maskless lithography writing in a subsequent stage.

On the other hand, if the differences or mismatches between the proximity correction pattern contour and the deformed pattern contour are present and not negligible, then method 400 proceeds to block 500, in which inconsistent pattern regions are checked. In other words, regions of mismatches between the deformed pattern contour and the proximity correction contour are examined to determine whether these mismatches are below a predetermined threshold or a specified limit. If the answer is yes, then the method 400 proceeds to the "data ready" stage of block 490. If the answer is no, then the method 400 proceeds to block 510, in which the deformed pattern is deemed to have failed the data accuracy verification process and is therefore not ready to be used for maskless lithography writing.

Referring back to FIG. 1, once the deformed pattern passes the data accuracy verification process and is "data ready" (i.e., at block 490 of FIG. 4), the method 100 proceeds to block 170 in which a maskless lithography writing process is performed. In an embodiment, the maskless lithography writing process includes an electron beam writing process, in which arrays of electron beams are used to write image patterns to a substrate or wafer according to the deformed pattern discussed above with reference to FIG. 4.

Figure 7:
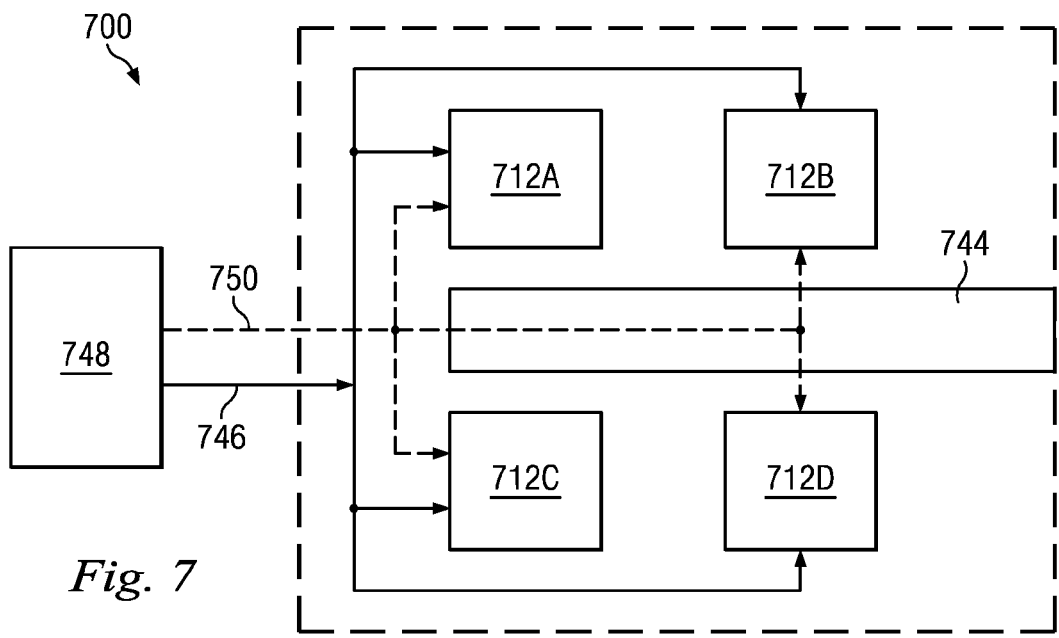
FIGS. 7-8 are simplified block diagrams of a maskless lithography system according to various aspects of the present disclosure.

FIG. 7 is a simplified block diagram of a maskless lithography apparatus according to an embodiment of the present disclosure. The lithography apparatus 700 has a plurality of writing chambers, each being designed to provide multiple radiation beams, and a circuit data path to provide circuit pattern data to each of the writing chambers, as discussed in greater detail below.

The maskless lithography apparatus 700 includes a plurality of writing chambers (scanning or patterning chambers) 712 to pattern wafers. In the illustrated embodiment, the maskless lithography apparatus 700 includes writing chambers 712A, 712B, 712C, and 712D that are integrated together. The writing chambers 712A-D are substantially identical to one another in terms of structure and is further described with reference to FIG. 8.

Figure 8:
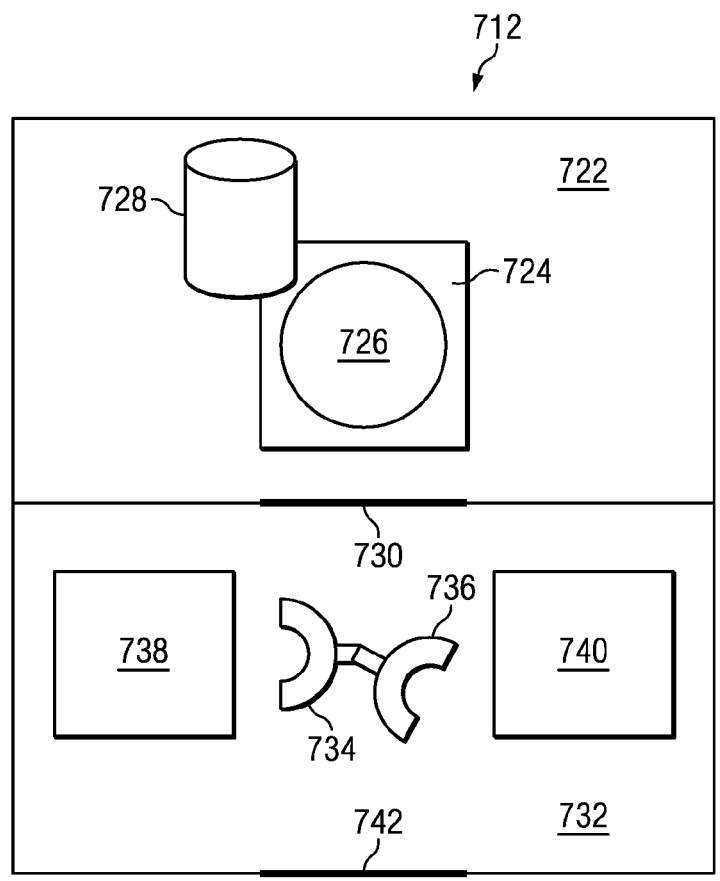
Figure 9:
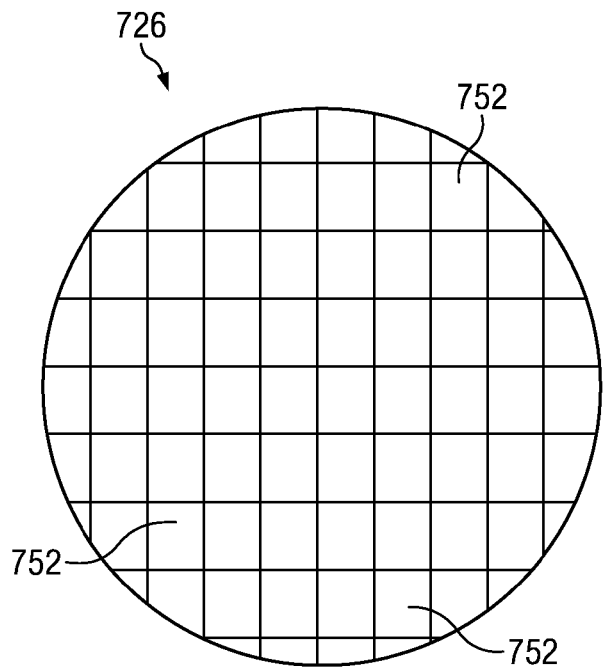
FIG. 9 is a simplified top view of a substrate undergoing a maskless lithography process.

Referring to FIG. 8, the writing chamber 712 includes a main (vacuum) chamber 722 for patterning (or writing). The main chamber 722 has a wafer stage 724 that is operable to secure and manipulate a substrate (or a wafer) 726 during the patterning process. The wafer is coated with an imaging layer sensitive to radiation energy. In one embodiment, the radiation energy includes an electron beam. The main chamber 722 may further include various vacuum pumps (not illustrated herein) to maintain the main vacuum chamber in a certain low pressure level for the writing process.

The main chamber 722 includes a multi-beam module 728 to provide multiple radiation beams to write the wafer 726. For example, the multiple radiation beams are directed to different regions (fields) of the wafer 726 such that each radiation beam is operable to write a desired pattern to a field of the wafer. In one embodiment, the multi-beam module 728 includes a multi-column cell having multiple columns integrated together. For example, the multi-column cell includes a set of micro-columns configured and spaced to be operable for simultaneously writing multiple beams to the wafer. Each column of the multi-column cell may include a source to supply the radiation energy (energy beam).

As noted earlier, the radiation energy includes an electron beam (e-beam) in one embodiment. For example, the electron beam source includes an electron gun of thermionic type or field emission type. Each column also includes a condenser lens system to redistribute the electron beam from the source. Each column also includes a scan deflector, such as an electrostatic deflector, to control the scan in a scanning mode either raster scan or vector scan. Each column also includes an objector lens, such as electromagnetic poles and/or electrostatic feature, to project the electron beam to the wafer. The multiple columns may share one electron source integrated to provide multiple electron beams. Alternatively, the multi-beam module 728 may include a single column operable to control multiple electron beams for the scan. For example, the single column is configured to direct the multiple electron beams to different fields and control the multiple electron beams for scanning in a synchronization mode.

The main chamber 722 may be additionally configured with various sensors (not shown), such as alignment sensors to monitor and assist with alignment and/or leveling sensors to monitor the leveling. The main chamber 722 also includes a gate 730 to a load lock chamber (or loadlock) 732 of the writing chamber 712 for wafer transferring. The loadlock 732 includes a robot to send a wafer to the main chamber through the gate 730 and/or receive a wafer from the main chamber through the gate 730. In another embodiment, the loadlock 732 includes two wafer handling robots 734 and 736 for efficient wafer transferring. The loadlock 732 may also include a wafer stage for pre-alignment. The loadlock may further include one or more sensors, such as pre-alignment sensor(s), to assist the process of the wafer pre-alignment. In another embodiment, the loadlock 732 includes two wafer stages 738 and 740 properly configured for efficient wafer transferring. The loadlock 732 further includes a second gate 742 to receive a wafer for writing or send a wafer out after the writing. The loadlock may also include one or more pumps configured to maintain the pressure of the loadlock chamber at a proper level.

According to various embodiments, the radiation energy may alternatively include an ion beam, an ultra-violet (UV) beam, or an extreme ultra-violet (EUV) beam. The wafer 726, to be patterned, may be a semiconductor wafer having silicon, germanium, diamond, or a compound semiconductor. Alternatively, it can be other type substrate such as glass for thin-film transistor liquid crystal display (TFT_LCD) devices or fused silicon/calcium fluoride for photomask.

The wafer 726 may include a plurality of layers formed thereon, each having patterned structures. The wafer 726 is coated with an imaging layer sensitive to the radiation energy used in the patterning process. For example, the imaging layer is sensitive to electron beam, ion beam, UV beam, or EUV beam. In the illustrated example, the wafer 726 includes a plurality of regions (fields) 752. The circuit pattern provided in the set of the circuit pattern data (a circuit data file or a writing data file) can be written to each of the fields by implementing the multiple beams and the set of circuit pattern data from the data path. The multiple beams are controlled to simultaneously write the circuit pattern to multiple fields. In one example, a field size is about 26 millimeters (mm)×33 mm or less.

Referring back to FIG. 7, the maskless lithography apparatus 700 includes an interface 744 designed as an interface between the plurality of writing chambers 712 and a track unit (not shown) coupled with the maskless lithography apparatus. The track unit is designed for implementing various processes to a wafer and the imaging layer on the wafer. In one embodiment, the track unit is integrated with the maskless lithography apparatus for efficient wafer lithography processes.

In one example, these processes to the imaging layer and the substrate may include coating the substrate with the image layer, baking the imaging layer, and developing the imaging layer. The interface may include a main robot (not shown) operable to transfer substrates between the track unit and each of the writing chambers. In various embodiments, the maskless lithography apparatus 700 may further include a buffer space in the interface, in the track unit, or in an area between the interface and the track unit to store substrate to be transferred into or out of the maskless lithography apparatus 700.

In one embodiment, the various main chambers, loadlock chambers, and the interface may be maintained at different pressure levels. For example, the loadlock chamber may be maintained at a pressure level higher than that of the main chamber. The interface may be maintained at the atmospheric pressure. In another embodiment, the interface is maintained at a low vacuum state with a pressure higher that that of the loadlock chambers.

Still referring to FIG. 7, the maskless lithography apparatus 700 further includes a data path 746 to transfer a set of circuit pattern data from a data server 748 to the maskless lithography apparatus 700. In an embodiment, the data server 748 includes one or more computer servers used to execute one or more of the offline and inline processes discussed above with reference to FIG. 1. In an embodiment, the data server 748 includes a non-transitory, tangible computer readable storage medium storing a computer program, wherein the computer program contains instructions that when executed, perform the methods 100, 400, and 600 discussed above.

The circuit pattern data has the information of integrated circuit pattern to be imaged on the substrate, specifically, to be formed on the imaging layer on wafers in each of the plurality of writing chambers. The data path may include proper physical features for data communication. For example, the data path 746 includes an optical fiber to implement data communication between the data server 748 and the maskless lithography apparatus 700.

Additionally, the maskless lithography apparatus 700 may include a buffer database (not shown) to store a portion of the set of circuit pattern data before it is distributed to the plurality of writing chambers 712. For example, a dynamic random access memory (DRAM) media may be used to store the circuit pattern data. The maskless lithography apparatus 700 may include a set of computing power, which can be field programmable gate-array (FPGA), graphics processing unit (GPU), central processing unit (CPU) or any other application-specific integrated circuit (ASIC) solution, to decompress, demultiplex the layout data and add in corrections for the process- and equipment-induced critical dimension (CD), overlay and stitching error in real time.

In one embodiment, the apparatus includes two sets of buffer databases, one being used for the current writing and another one is used for loading a next set of circuit pattern data. The data server 748 may be a data center, such as a computer with a data storage, to store integrated circuit design data (such as tapeout data) and to provide a proper circuit design data to the maskless lithography apparatus. The data server 748 may include a central processing unit (CPU), random access memory (RAM), and other proper modules. In another embodiment, the data server 748 includes a storage media large enough to store various pattern designs of different circuit designs.

In one embodiment, the maskless lithography apparatus 700 further includes a clock module 750 coupled to the plurality of the writing chambers and a mechanism to provide a clock signal through a clock wire to the plurality of writing chambers of the maskless lithography apparatus to synchronize the writing processes of the plurality of writing chambers and the wafer stages in the main chambers, such that the set of circuit pattern data can be written to various wafers respectively by the writing chambers and, furthermore, written to various fields of each wafer in a synchronization mode. The clock signal can be provided from the data server or alternatively provided from other proper control module integrated with or coupled with the maskless lithography apparatus 700. In one example, the clock signal can be generated by a circuit. In another example, the clock signal can be generated by a circuit based on an intrinsic frequency of quartz crystal oscillation.

In another embodiment, each writing chamber may additionally include a chamber database to store a portion of the circuit pattern data. In another embodiment, the maskless lithography apparatus 700 further includes one or more computers (not shown) integrated inside its various locations. The computer is connected to control and regulate various processing functions of the apparatus 700.

Figure 10:
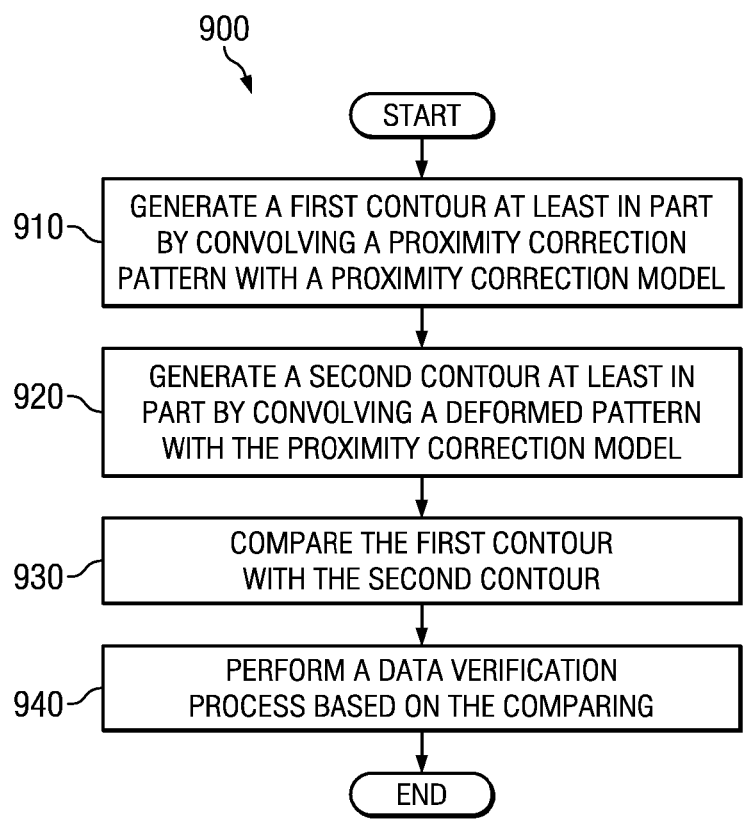
FIG. 10 is a flowchart illustrating a method of performing a maskless lithography process according to various aspects of the present disclosure.

FIG. 10 illustrates a flowchart of a method 900 for performing a maskless lithography process according to various aspects of the present disclosure. The method 900 includes block 910 in which a first contour is generated at least in part by convolving a proximity correction pattern with a proximity correction model. The proximity correction pattern may be obtained by applying a proximity correction process to an IC layout plan. The first contour is also generated in part by applying an electron beam correction or compensation model to the results of the convolution process of block 910.

The method 900 includes block 920 in which a second contour is generated at least in part by convolving a deformed pattern with the proximity correction model. The deformed pattern may be derived from the proximity correction pattern by applying one or more correction processes to the proximity correction pattern. The second contour is also generated in part by applying the electron beam correction or compensation model to the results of the convolution process of block 920.

The method 900 includes block 930 in which the first contour is compared with the second contour. The comparison process in block 930 may include identifying differences or mismatches in geometries between the first contour and the second contour.

The method 900 includes block 940 in which a data verification process is performed based on the comparing. The data verification process may include verifying the deformed pattern as being lithography-ready if the comparison process of block 930 indicates that a difference between the first and second contours is under a specified limit or within a predetermined threshold.

It is understood that additional processes may be performed before, between, or after the blocks 910-940 of method 900. For example, after the data verification process of block 940 is performed, the method 900 may proceed with performing a maskless lithography process using the deformed pattern if the deformed pattern is deemed to be lithography ready. The maskless lithography process may include an electron beam writing process.

The various embodiments of performing a maskless lithography as discussed above offer advantages compared to conventional lithography processes, it being understood that other embodiments may offer different advantages, and that no particular advantage is required for all embodiments. One of the advantages is that the contours of the proximity correction patterns and the deformed patterns more accurately represent the actual fabricated pattern images on a wafer. Thus, the comparison between these contours (as opposed to a comparison between these patterns directly) offers a better indication of the deformed pattern's data accuracy. Thus, the methods of the present disclosure will reduce unnecessary data verification failures. Another advantage is that it may be easier to compare the geometries of the contours of patterns, rather than comparing the patterns directly. Thus, the methods of the present disclosure may be faster to execute and may reduce overall process time. Another advantage of the present disclosure is that the methods discussed can be easily integrated within existing maskless lithography fabrication schemes.

One of the broader forms of the present disclosure involves a method of fabricating a semiconductor device. The method includes: generating a first contour at least in part by convolving a proximity correction pattern with a proximity correction model; generating a second contour at least in part by convolving a deformed pattern with the proximity correction model; comparing the first contour with the second contour; and performing a data verification process based on the comparing.

Another one of the broader forms of the present disclosure involves a method of performing a maskless lithography process. The method includes: providing a proximity correction pattern; generating a deformed pattern based on the proximity correction pattern; performing a first convolution process to the proximity correction pattern to generate a first proximity correction pattern contour; processing the first proximity correction pattern contour to generate a second proximity correction pattern contour; performing a second convolution process to the deformed pattern to generate a first deformed pattern contour; processing the first deformed pattern contour to generate a second deformed pattern contour; identifying mismatches between the second proximity correction pattern contour and the second deformed pattern contour; and determining whether the deformed pattern is lithography-ready in response to the identifying.

Yet another one of the broader forms of the present disclosure involves an apparatus comprising a non-transitory, tangible computer readable storage medium storing a computer program, wherein the computer program contains instructions that when executed, perform: providing a proximity correction pattern; deriving a deformed pattern based on the proximity correction pattern; generating a proximity correction pattern contour at least in part by convolving the proximity correction pattern with a proximity correction model; generating a deformed pattern contour at least in part by convolving the deformed pattern with the proximity correction model; comparing geometries of the proximity correction pattern contour with geometries of the deformed pattern contour; and determining whether the deformed pattern is ready to be used in a maskless lithography writing process in response to the comparing.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A method of performing a maskless lithography process, comprising:

providing a proximity correction pattern, wherein the proximity correction pattern has a first geometric shape;

generating a deformed pattern based on the proximity correction pattern, wherein the deformed pattern has a second geometric shape that resembles the first geometric shape;

performing a first convolution process to the proximity correction pattern to generate a first proximity correction pattern contour;

processing the first proximity correction pattern contour to generate a second proximity correction pattern contour;

performing a second convolution process to the deformed pattern to generate a first deformed pattern contour;

processing the first deformed pattern contour to generate a second deformed pattern contour;

identifying mismatches between the second proximity correction pattern contour and the second deformed pattern contour; and determining whether the deformed pattern is lithography-ready in response to the identifying;

wherein at least one of: the performing the first convolution process, the processing the first proximity correction pattern contour, the performing the second convolution process, the processing the first deformed pattern contour, the identifying mismatches, and the determining is performed by one or more electronic processors.

2. The method of claim 1, wherein the generating the deformed pattern includes applying one or more error correction processes to the proximity correction pattern.

3. The method of claim 1, wherein:
the performing the first convolution process includes convolving the proximity correction pattern with a proximity correction model; and
the performing the second convolution process includes convolving the deformed pattern with the proximity correction model.

4. The method of claim 1, wherein the processing the first proximity correction pattern and the processing the first deformed pattern are each carried out using a beam model.

5. The method of claim 1, wherein the determining includes:
if the identifying indicates there are no mismatches between the second proximity correction pattern contour and the second deformed pattern contour, then verifying the deformed pattern as being lithography-ready;
if the identifying indicates that the mismatches between the second proximity correction pattern contour and the second deformed pattern contour are within a predetermined threshold, then verifying the deformed pattern as being lithography-ready; and
if the identifying indicates that the mismatches between the second proximity correction pattern contour and the second deformed pattern contour exceed the predetermined threshold, then classifying the deformed pattern as not being lithography-ready.

6. The method of claim 5, further including: performing a maskless lithography writing process if the deformed pattern is verified as being lithography-ready.

7. The method of claim 6, wherein the maskless lithography writing process includes an electron beam writing process.

8. The method of claim 6, wherein the maskless lithography writing process is performed using a maskless lithography machine, the maskless lithography machine containing the one or more electronic processors for performing at least one of: the performing the first convolution process, the processing the first proximity correction pattern contour, the performing the second convolution process, the processing the first deformed pattern contour, the identifying mismatches, and the determining is performed.

9. The method of claim 1, wherein the proximity correction pattern is derived from an integrated circuit (IC) layout file.

10. The method of claim 1, wherein the proximity correction pattern and the deformed pattern do not have a one-to-one correspondence in appearance.

11. The method of claim 1, wherein the deformed pattern is generated by performing at least one of the following processes to the proximity correction pattern: an error correction process, a noise reduction process, a dithering process, a snapping process, and a beam correction process.

12. An apparatus comprising a non-transitory, tangible computer readable storage medium storing a computer program, wherein the computer program contains instructions that when executed by a computer, perform:
providing a proximity correction pattern;
deriving a deformed pattern based on the proximity correction pattern;
generating a proximity correction pattern contour at least in part by convolving the proximity correction pattern with a proximity correction model;
generating a deformed pattern contour at least in part by convolving the deformed pattern with the proximity correction model;
comparing geometries of the proximity correction pattern contour with geometries of the deformed pattern contour; and
determining whether the deformed pattern is ready to be used in a maskless lithography writing process in response to the comparing, wherein the determining includes verifying the deformed pattern as being ready to be used in the maskless lithography writing process if the comparing indicates that mismatches between the proximity correction pattern contour and the deformed pattern contour are within a predetermined threshold.

13. The apparatus of claim 12, wherein the instructions for the generating the proximity correction pattern contour and the generating the deformed pattern contour include instructions for applying a beam compensation model to the proximity correction pattern and the deformed pattern.

14. The apparatus of claim 12, further including:
instructions for providing an integrated circuit (IC) layout plan; and
applying a proximity correction process to the IC layout plan to generate the proximity correction pattern.

15. The apparatus of claim 12, wherein the deformed pattern is derived by performing at least one of the following processes to the proximity correction pattern: an error correction process, a noise reduction process, a dithering process, a snapping process, and a beam correction process.

16. A maskless lithography system, comprising:
one or more writing chambers each configured to provide multiple radiation beams for patterning wafers; and
a data server communicatively coupled to the one or more writing chambers, the data server including one or more electronic processors configured to execute the following:
providing a proximity correction pattern;
generating a deformed pattern based on the proximity correction pattern, wherein the deformed pattern has a similar overall appearance as the proximity correction pattern;
performing a first convolution process to the proximity correction pattern to generate a first proximity correction pattern contour;

processing the first proximity correction pattern contour to generate a second proximity correction pattern contour;

performing a second convolution process to the deformed pattern to generate a first deformed pattern contour;

processing the first deformed pattern contour to generate a second deformed pattern contour;

identifying mismatches between the second proximity correction pattern contour and the second deformed pattern contour; and determining whether the deformed pattern is lithography-ready in response to the identifying.

17. The method of claim 16, wherein the generating the deformed pattern includes performing at least one of the following processes to the proximity correction pattern: an error correction process, a noise reduction process, a dithering process, a snapping process, and a beam correction process.

18. The method of claim 16, wherein:
the performing the first convolution process includes convolving the proximity correction pattern with a proximity correction model; and
the performing the second convolution process includes convolving the deformed pattern with the proximity correction model.

19. The method of claim 16, wherein the processing the first proximity correction pattern and the processing the first deformed pattern are each carried out using a beam model.

20. The method of claim 16, wherein the determining includes:
if the identifying indicates there are no mismatches between the second proximity correction pattern contour and the second deformed pattern contour, then verifying the deformed pattern as being lithography-ready;

if the identifying indicates that the mismatches between the second proximity correction pattern contour and the second deformed pattern contour are within a predetermined threshold, then verifying the deformed pattern as being lithography-ready; and if the identifying indicates that the mismatches between the second proximity correction pattern contour and the second deformed pattern contour exceed the predetermined threshold, then classifying the deformed pattern as not being lithography-ready;

and further comprising: performing a maskless lithography writing process if the deformed pattern is verified as being lithography-ready.

* * * * *